US011769681B2

(12) United States Patent
Jeon et al.

(10) Patent No.: US 11,769,681 B2
(45) Date of Patent: Sep. 26, 2023

(54) TRANSFER ROBOT AND SUBSTRATE PROCESSING APPARATUS HAVING THE SAME

(71) Applicant: WONIK IPS CO., LTD., Pyeongtaek-si (KR)

(72) Inventors: Kyung Hee Jeon, Osan-si (KR); Dong Sun Ko, Osan-si (KR); Hun Hee Na, Seoul (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 244 days.

(21) Appl. No.: 17/200,510

(22) Filed: Mar. 12, 2021

(65) Prior Publication Data

US 2021/0305075 A1 Sep. 30, 2021

(30) Foreign Application Priority Data

Mar. 24, 2020 (KR) ........................ 10-2020-0035763

(51) Int. Cl.
*H01L 21/677* (2006.01)
*H01L 21/687* (2006.01)

(52) U.S. Cl.
CPC .. *H01L 21/67766* (2013.01); *H01L 21/67742* (2013.01); *H01L 21/68707* (2013.01)

(58) Field of Classification Search
None
See application file for complete search history.

(56) References Cited

U.S. PATENT DOCUMENTS 11,358,809 B1 * 6/2022 Thanu ............... H01L 21/67745
11,482,434 B2 * 10/2022 Yang ................. H01L 21/67742
(Continued)

*Primary Examiner* — Kaitlin S Joerger
(74) *Attorney, Agent, or Firm* — William Park & Associates Ltd.

(57) ABSTRACT

The present invention disclosed herein relates to a transfer robot and a substrate processing apparatus having the same, and more particularly, to a transfer robot for transferring a substrate through a transfer module and a substrate processing apparatus having the same. The substrate processing system according to the present invention includes: a transfer module (300) provided with a transfer robot (500) configured to transfer substrates (10); one or more dual process modules (100) each of which is installed at one side of the transfer module (300) so that two substrates (10) are accessible at the same time and on which a pair of substrate support units (13) configured to respectively seat the two substrates (10) thereon are disposed horizontally; and one or more single process modules (200) each of which is installed at one side of the transfer module (300) so that one substrate (10) is accessible and on which one or more substrate support units (13) configured to seat the substrates (10) thereon are provided. The transfer robot (500) includes a first substrate seating unit (510*a*) and a second substrate seating unit (510*b*), each of which has a seating surface (11), on which the substrate (10) is seated, and which are disposed on the same first plane, and at least one of the first substrate seating unit (510*a*) or the second substrate seating unit (510*b*) is installed to be rotatable about a vertical rotation axis (C1) so as to be disposed in a region in which the at least one of the first substrate seating unit (510*a*) or the second substrate seating unit (510*b*) does not interfere with the substrate transfer when the substrates (10) are transferred.

13 Claims, 10 Drawing Sheets

(56) References Cited

U.S. PATENT DOCUMENTS

| | | | |
|---|---|---|---|
| 2019/0061165 A1* | 2/2019 | Rajendran | B25J 13/086 |
| 2020/0075376 A1* | 3/2020 | Fukasawa | H01L 21/67745 |
| 2020/0075377 A1* | 3/2020 | Wakabayashi | H01L 21/67196 |
| 2020/0161162 A1* | 5/2020 | Yang | H01L 21/67201 |
| 2020/0384636 A1* | 12/2020 | Muthukamatchy | B25J 9/1653 |
| 2021/0013067 A1* | 1/2021 | Carlson | H01L 21/68 |
| 2021/0013068 A1* | 1/2021 | Schaller | H01L 21/67748 |
| 2021/0118719 A1* | 4/2021 | Wilkas | B25J 9/043 |
| 2021/0407837 A1* | 12/2021 | Hudgens | B25J 15/0014 |
| 2022/0005726 A1* | 1/2022 | Hudgens | B25J 9/042 |
| 2022/0044952 A1* | 2/2022 | Wakabayashi | H01L 21/67742 |
| 2022/0285191 A1* | 9/2022 | Li | H01L 21/68707 |

* cited by examiner

TRANSFER ROBOT AND SUBSTRATE PROCESSING APPARATUS HAVING THE SAME

CROSS-REFERENCE TO RELATED APPLICATIONS

This U.S. non-provisional patent application claims priority under 35 U.S.C. § 119 of Korean Patent Application No. 10-2020-0035763, filed on Mar. 24, 2020, the entire contents of which are hereby incorporated by reference.

FIELD OF THE INVENTION

The present invention disclosed herein relates to a transfer robot and a substrate processing apparatus having the same, and more particularly, to a transfer robot for transferring a substrate through a transfer module and a substrate processing apparatus having the same.

BACKGROUND ART

In general, a cluster-type substrate processing system includes a transfer module provided with a transfer robot for transferring a substrate, one or more process modules installed at one side of the transfer module to perform substrate processing, and a load lock module installed at one side of the transfer module to transfer the substrate from the outside or receive the processed substrate.

Here, the process module may be a dual process module including a pair of substrate support units on which two substrates are mounted or a single process module including a single substrate support unit on which one substrate is mounted.

In the case of the single process module, one substrate may be accessible at a time.

In the case of the dual process module, two substrates may be accessible at the same time.

In the case of the transfer robot for transferring the substrate to the typical single process module, since only one substrate is transferred as a time, but two substrates are not transferred at a time, efficiency of the substrate transferring of the dual process module may be very low. On the other hand, in the case of the transfer module for transferring the substrate to the dual process module, since two end effectors have to be provided side by side, it is impossible to transfer the substrate to the single process module.

As a result, in the case of the typical processing system, the substrate processing system is divided into a substrate processing system for the single process module and a substrate processing system for the dual process module.

However, in a complex process in which both the single process module and the dual process module are required according to the substrate processing process, if the substrate processing system for the single process module and the substrate processing system for the dual process module are separately constructed, when the substrate is transferred to other substrate processing system, the substrate may be inevitably exposed to the atmosphere to deteriorate quality factors of the substrate processing, and a time taken to transfer the substrate between the substrate processing systems may increase to deteriorate an output.

SUMMARY OF THE INVENTION

To solve the above-mentioned limitations, the prevent invention provides a transfer robot, which includes both a single process module and a dual process module in one substrate processing system, and a substrate processing system having the same.

In accordance with an embodiment of the present invention, a substrate processing system includes: a transfer module 300 provided with a transfer robot 500 configured to transfer substrates 10; one or more dual process modules 100 each of which is installed at one side of the transfer module 300 so that two substrates 10 are accessible at the same time and on which a pair of substrate support units 13 configured to respectively seat the two substrates 10 thereon are disposed horizontally, and one or more single process modules 200 each of which is installed at one side of the transfer module 300 so that one substrate 10 is accessible and on which one or more substrate support units 13 configured to seat the substrates 10 thereon are provided.

The transfer robot 500 may include a first substrate seating unit 510a and a second substrate seating unit 510b, each of which has a seating surface 11, on which the substrate 10 is seated, and which are disposed on the same first plane.

At least one of the first substrate seating unit 510a or the second substrate seating unit 510b may be installed to be rotatable about a vertical rotation axis C1 so as to be disposed in a region in which the at least one of the first substrate seating unit 510a or the second substrate seating unit 510b does not interfere with the substrate transfer when the substrates 10 are transferred.

When the substrates 10 are transferred to the dual process module 100, the first substrate seating unit 510a and the second substrate seating unit 510b may be disposed side by side to transfer the two substrates 10 at the same time to the dual process module 100.

When the substrates 10 are transferred to the single process module 200, one of the first substrate seating unit 510a and the second substrate seating unit 510b may be accessible to the single process module 200 so as to transfer one substrate 10.

The other one of the first substrate seating unit 510a and the second substrate seating unit 510b may be disposed in a region in which the other one of the first substrate seating unit 510a and the second substrate seating unit 510b does not interfere with the substrate transfer.

When the substrates 10 are transferred to the single process module 200, one of the first substrate seating unit 510a and the second substrate seating unit 510b may be accessible to the single process module 200 to unload the substrate 10 from the single process module 200, and the other one of the first substrate seating unit 510a and the second substrate seating unit 510b may be on standby in a region in which the other one of the first substrate seating unit 510a and the second substrate seating unit 510b does not interfere with the substrate transfer in the state in which the substrate 10 to be loaded into the single process module 200 is seated.

The transfer robot 500 may further include: a first coupling unit 502, to which the first substrate seating unit 510a and the second substrate seating unit 510b are coupled; a driving unit 540 configured to perform "movement of the first coupling unit 502 in a three-dimensional space" and "rotation of at least one of the first substrate seating unit 510a or the second substrate seating unit 510b with respect to the rotation axis C1"; and a control unit configured to control an operation of the driving unit 540.

The first substrate seating unit 510a and the second substrate seating unit 510b may be driven to rotate independently from each other with respect to the rotation axis C1.

The transfer robot 500 may further include a third substrate seating unit 510c and a fourth substrate seating unit 510d, which are disposed side by side on a second plane that is parallel to the first plane and vertically spaced apart from the first plane and are coupled to the first coupling unit 502.

The third substrate seating unit 510c and the fourth substrate seating unit 510d may be installed to be rotatable around the rotation axis C1.

When the substrates 10 are transferred to the dual process module 100, the third substrate seating unit 510c and the fourth substrate seating unit 510d may be on standby in regions in which the third substrate seating unit 510c and the fourth substrate seating unit 510d do not interfere with the substrate transfer in a state in which the two substrates 10 to be loaded into the dual process module 100 are seated.

The first substrate seating unit 510a and the third substrate seating unit 510c may be rotationally symmetric about the rotation axis C1.

The second substrate seating unit 510b and the fourth substrate seating unit 510d may be rotationally symmetric about the rotation axis C1.

The first substrate seating unit 510a, the second substrate seating unit 510b, the third substrate seating unit 510c, and the fourth substrate seating unit 510d may be driven to rotate independently from each other with respect to the rotation axis C1.

The substrate processing system may further include a load lock module 400 coupled to one side of the transfer module 300 to transfer the substrate 10 between the transfer modules 3).

In accordance with an embodiment of the present invention, a transfer robot is provided in a transfer module 300 of a substrate processing system including: the transfer module 300 configured to transfer substrates 10; one or more dual process modules 100 each of which is installed at one side of the transfer module 300 so that two substrates 10 are accessible at the same time and on which a pair of substrate support units 13 configured to respectively seat the two substrates 10 thereon are disposed horizontally; and one or more single process modules 200 each of which is installed at one side of the transfer module 300 so that one substrate 10 is accessible and on which one or more substrate support units 13 are provided.

The transfer robot may include: a first substrate seating unit 510a and a second substrate seating unit 510b, each of which has a seating surface 11, on which the substrate 10 is seated, and which are disposed on the same first plane, wherein at least one of the first substrate seating unit 510a or the second substrate seating unit 510b may be installed to be rotatable about a vertical rotation axis so as to be disposed in a region in which the at least one of the first substrate seating unit 510a or the second substrate seating unit 510b does not interfere with the substrate transfer when the substrates 10 are transferred.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Figure 1A:
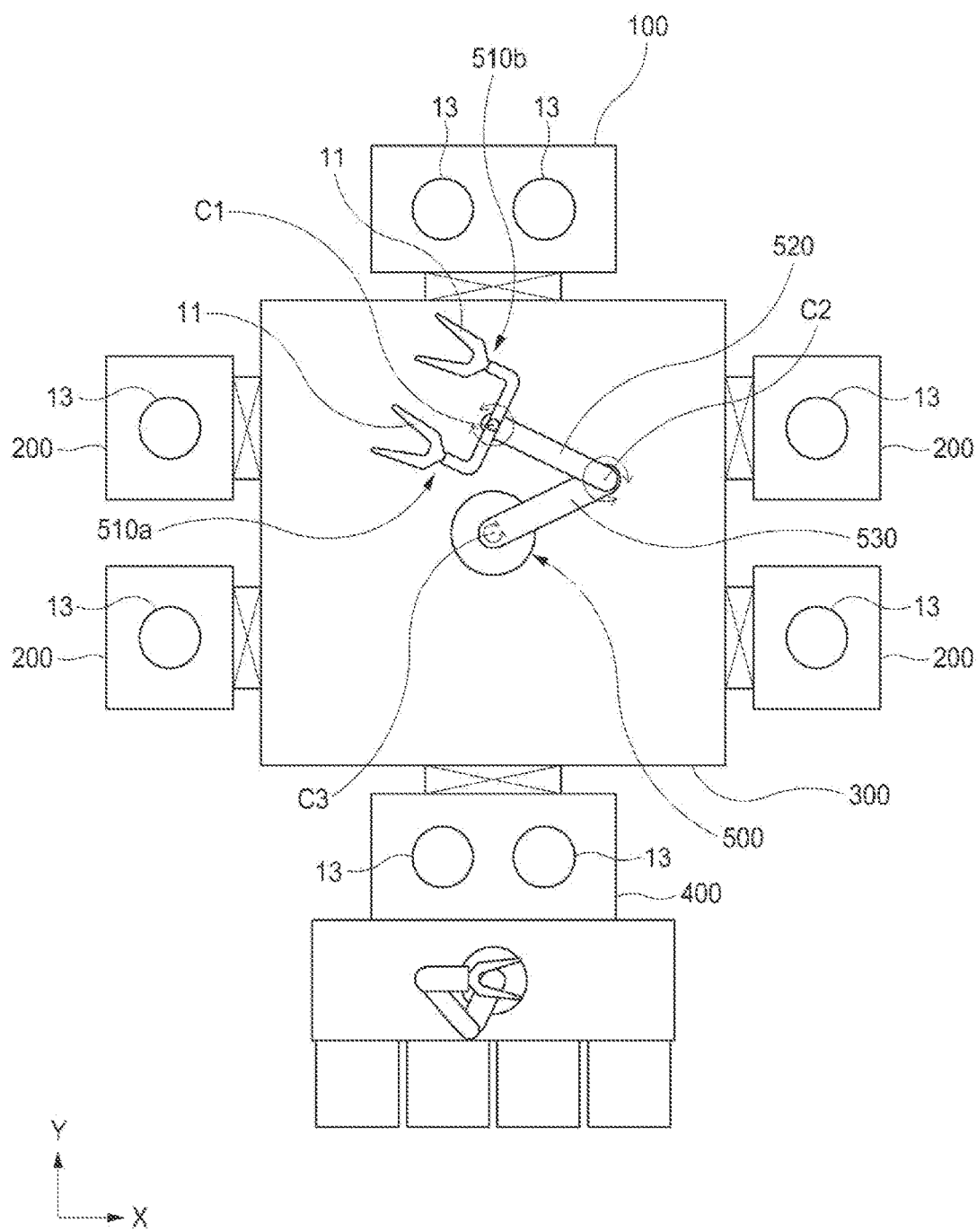
FIGS. 1A and 1B are plan views of a substrate processing system according to an embodiment of the present invention.
Figure 1B:
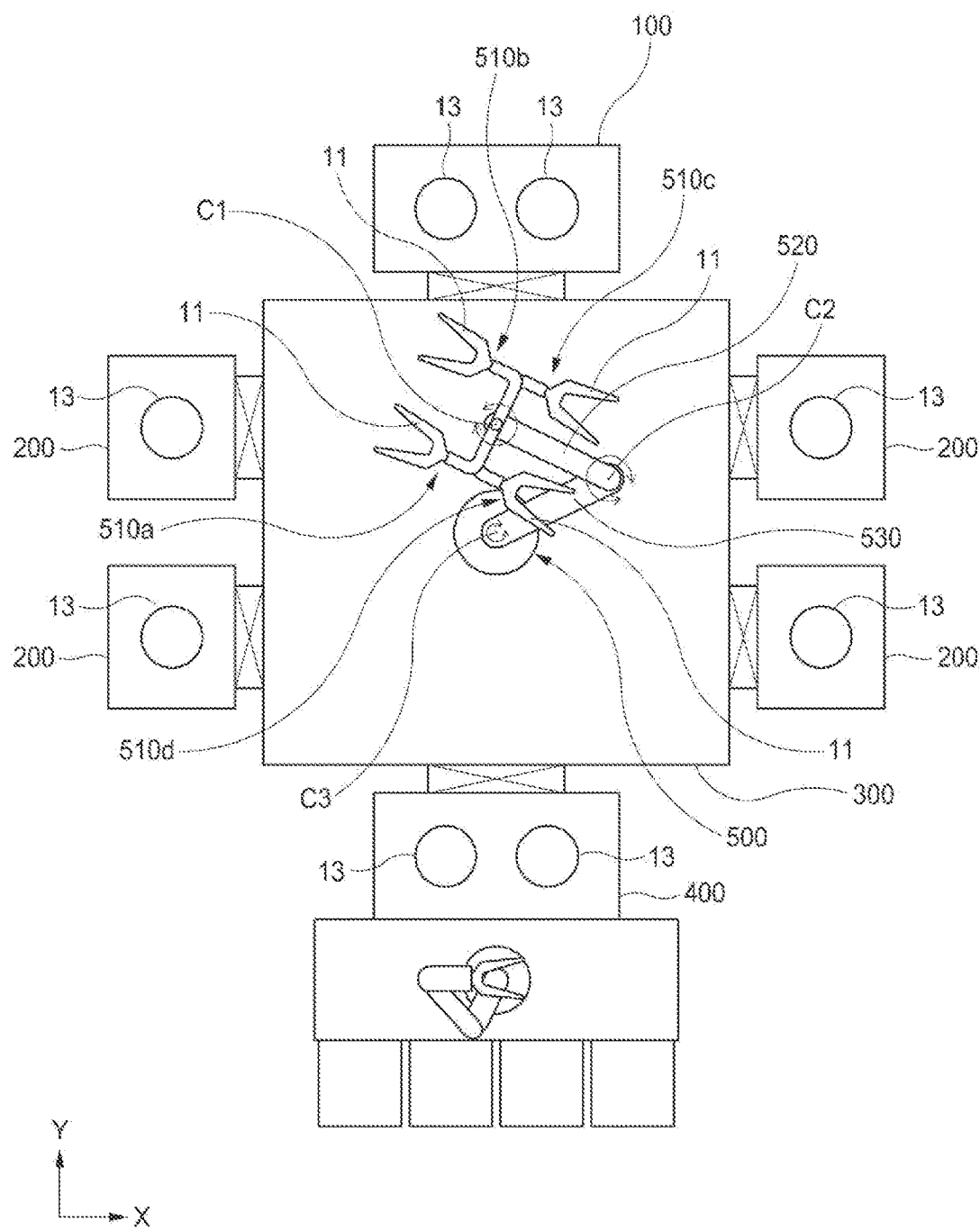

Hereinafter, a substrate processing system according to the present invention will be described with reference to the accompanying drawings.

A substrate processing system according to the present invention may be a system for performing substrate processing such as deposition, etching, and the like on a substrate 10. As illustrated in FIGS. 1A to 5B, the substrate processing system may include a transfer module provided with a transfer robot 500 for transferring the substrate 10, one or more dual process modules 100 each of which is installed at one side of the transfer module 300 so that two substrates 10 are accessible at the same time and on which a pair of substrate support units 13 for respectively seating the two substrates 10 thereon are disposed horizontally, and one or more single process modules 200 each of which is installed at one side of the transfer module 3M) so that one substrate 10 is accessible and on which one substrate support unit 13 for seating the substrate 10 thereon is provided.

Here, the substrate 10 may include a variety of substrates such as a semiconductor wafer, a glass substrate for an LCD panel, an OLED substrate, a solar cell substrate, and the like.

The transfer module 300 includes a transfer module 500 for transferring the substrate 10 and is provided in various configurations.

The transfer module 300 may include a plurality of gates through which the substrate is accessible through the transfer robot 500 in a side surface thereof.

The transfer module 300 may be configured so that a substrate to be processed is transferred from the load lock module 400, which will be described below, to process chambers 100 and 200, which will be described below, a processed substrate from the process chambers 100 and 200 to the load lock module 400, or a substrate is transferred from one process module 100 or 200 to the other process module 100 or 200.

The transfer module 300 may include a vacuum system for forming an inner space of the transfer module 300 into a vacuum atmosphere.

The transfer module 300 may have a rectangular structure such as a square, hexagonal, octagonal shape on a plane.

The one or more dual process modules 100 may be process modules, each of which is installed at one side of the transfer module 300 so that two substrates 10 are processed at the same time.

A gate through which the substrate is accessible may be provided between the dual process module 100 and the transfer module 3).

The dual process module 100 may be provided in various configurations so as to include a process chamber that forms a sealed processing space according to types of the substrate processing such as heating, cooling, sputtering, CVD, PVD, and the like and a gas injection unit that injects a gas into the processing space.

The pair of substrate support units 13 on which two substrates 10 are respectively seated may be provided side by side in the dual process module 100.

The pair of substrate support units 13 may be disposed side by side in a horizontal direction.

In the dual process module 100, two substrates 10 may be accessible at the same time.

An inner space of the dual process module 100 may be divided into two processing regions for processing the substrate or may include one processing region.

Also, the dual process module 100 may include a vacuum system for forming the inner space of the dual process module 100 into a vacuum atmosphere.

The one or more single process modules 100 may be process modules, each of which is installed at one side of the transfer module 300 to allow one substrate 10 to be accessible at a time.

A gate through which the substrate is accessible may be provided between the single process module 200 and the transfer module 300.

The single process module 200 may be provided in various configurations so as to include a process chamber that forms a sealed processing space according to types of the substrate processing such as heating, cooling, sputtering, CVD, PVD, and the like and a gas injection unit that injects a gas into the processing space.

One or more substrate support units 13 for mounting the substrate may be provided in the single process module 200.

Also, the single process module 200 may include a vacuum system for forming the inner space of the single process module 200 into a vacuum atmosphere.

Here, the substrate processing system may further include a load lock module 400 coupled to one side of the transfer module 300 to transfer the substrate 10 between the transfer modules 300.

The load lock module 400 may be provided in various configurations so that an environmental condition that is close to an environmental condition in the transfer module 100 is formed, and the environmental condition in the transfer module 100 is prevented from being affected by the outside.

That is, the load lock module 400 may change the inner space from a process pressure state that is close to vacuum into an atmospheric pressure state or from the atmospheric pressure state into the process pressure state.

Also, the load lock module 400 may receive the substrate 10 from a loader unit connected to the outside under the atmospheric pressure, for example, a substrate storage container (not shown).

One surface of the load lock module 400 is connected to the loader unit, and the other surface of the load lock module 400 may be coupled to the transfer module 100 through the gate.

After the substrate 10 is transferred from a standby state through the loader unit, the inside of the load lock module 400 may be changed to the process pressure state that is close to the vacuum similar to that of the transfer module 300, and the substrate within the load lock module 400 may be transferred to the transfer module 300 by the transfer robot 500.

On the contrary, when the substrate 100 that is processed in the process modules 100 and 200 is transferred to the load lock module 400 via the transfer module 300, the inside of the load lock module 400 may be changed into the atmospheric pressure state so that the substrate 10 is transferred into an external substrate storage container FOUP via the loader unit.

The above-described transfer of the substrate between the transfer module 300 and the load lock module 400 and the above-described transfer of the substrate between the transfer module 300 and the process modules 100 and 200 may be performed by the transfer robot 500 provided in the transfer module 300.

The transfer robot 500 may be provided in various configurations to support and transfer the substrate 10. For example, the transfer robot 500 may be provided as a horizontal articulated robot or a SCARA robot.

The transfer robot 500 according to the present invention may be configured to include both the dual process module 100 and the single process module 200 in one substrate processing system.

The transfer robot 500 according to the present invention may adaptively perform the substrate transfer to the dual process module 100 and the single process module 200. Therefore, a plurality of complex processes may be performed in the one substrate processing system without limitation, and also, an output may increase due to the efficient substrate transfer, and possibility of exposure of the substrate to the atmosphere may be minimized to improve quality factors of the substrate processing.

The transfer robot 500 is configured to perform transfer that is freely variable between transfer of two substrates to the dual process module 100 and transfer of one substrate to the single process module 200.

For example, the transfer robot 500 may include a first substrate seating unit 510a and a second substrate seating unit 510b, each of which has a seating surface 11, on which the substrate 10 is seated, and which are disposed on the same first plane.

The first substrate seating unit 510a and the second substrate seating unit 510b may be portions, which directly act on the substrate 10 through the seating surface 11, and may correspond to an end arm coupled to a distal end of the transfer robot 500 and an end effector that is fixedly coupled to the end arm.

The first substrate seating unit 510a and the second substrate seating unit 510b may have various configurations and shapes as long as the first substrate seating unit 510a and the second substrate seating unit 510b are capable of stably supporting the substrate 10.

An end effector area having the seating surface 11 may be formed in a two-branched fork shape as illustrated in FIG. 1A, but is not limited thereto.

At least one of the first substrate seating unit 510a or the second substrate seating unit 510b may be installed to be rotatable about a vertical rotation axis C1 so as to be disposed in a region in which the at least one of the first substrate seating unit 510a or the second substrate seating unit 510b does not interfere with the substrate transfer when the substrates 10 are transferred.

More specifically, the transfer robot 500 may include a first coupling unit 502, to which the first substrate seating unit 510a and the second substrate seating unit 510b are coupled, a driving unit 540 that performs "movement of the first coupling unit 502 in a three-dimensional space" and "rotation of at least one of the first substrate seating unit 510a or the second substrate seating unit 510b with respect to the rotation axis", and a control unit that controls an operation of the driving unit 540.

The first coupling unit 502 may be provided in various configurations as a coupling hub in which the first substrate seating unit 510a and the second substrate seating unit 510b are coupled to each other and which forms a vertical rotation axis C1.

At least one of the first substrate seating unit 510a or the second substrate seating unit 510b may be coupled to the first coupling unit 502 so as to be rotatable about the vertical rotation axis C1.

For example, one of the first substrate seating unit 510a and the second substrate seating unit 510b may be rotatably coupled to the first coupling unit 502, and the other may be fixedly coupled to the first coupling unit 502.

As another example, each of the first substrate seating unit 510a and the second substrate seating unit 510b may be rotatably coupled to the first coupling unit 502.

Here, the first substrate seating unit 510a and the second substrate seating unit 510b may rotate independently from each other with respect to the rotation axis.

The driving unit 540 may be provided in various configuration as a constituent that drives an operation of the transfer robot 500, i.e., performs "the movement of the first coupling unit 502 in the three-dimensional space" and "the rotation of at least one of the first substrate seating unit 510a or the second substrate seating unit 510b with respect to the rotation axis C1", and a control unit that controls an operation of the driving unit 540.

The driving unit 540 may include one or more motors for performing "the movement of the first coupling unit 502 in the three-dimensional space" and "the rotation of at least one of the first substrate seating unit 510a or the second substrate seating unit 510b with respect to the rotation axis C1".

The motor may be fixedly installed under the transfer module 300.

Here, the transfer robot 500 may include a plurality of robot arm units 520 and 530 installed between the driving unit and the first coupling unit 502 to perform the movement of the first coupling unit 502 in the three-dimensional space.

For example, the transfer robot 500 may include a first robot arm unit 520 having one end fixedly coupled to the first coupling unit 502 and a second robot arm unit 530 installed between the first robot arm unit 520 and the driving unit.

Here, a link member 504 for rotation of the first robot arm unit 520 about a rotation axis C2 may be provided between the first robot arm unit 520 and the second robot arm unit 530.

Also, a link member 506 for rotation of the second robot arm 530 about a rotation axis C3 may be provided between the second robot arm unit 530 and the driving unit.

Although not shown, an embodiment in which three or more robot arm units to which the transfer robot 500 is rotatably coupled to be linked to each other may also be implemented.

Both the first robot arm unit 520 and the second robot arm unit 530 may be installed to be rotatable about the axes C2 and C3 that are perpendicular to a horizontal plane, but are not limited thereto.

According to the rotational driving of the plurality of robot arm units 520 and 530, the position of the first coupling unit 502 in the three-dimensional space may vary.

Driving force generated by the driving unit 540 may be transmitted to the first robot arm unit 520, the second robot arm unit 530, and the first substrate seating unit 510a to the second substrate seating unit 510b through various power transmission parts such as a pulley-belt structure.

For example, each of the power transmission parts may include a belt (not shown) and a pulley (not shown) wound around the belt (not shown).

The pulley (not shown) may rotate by the driving unit 540.

Here, the pulley (not shown) may be installed to the link members 504 and 506 and the first coupling unit 502 to perform the rotation of the first substrate seating unit 510a, the second substrate seating unit 510b, and the robot arm units 520 and 530.

Here, the belt (not shown) wound around the pulley (not shown) may be connected from the driving unit 540 to the first to second substrate seating units 510a to 510b through an empty space inside the transfer robot 500.

Also, the pulley (not shown) has a multi-stage structure of a plurality of pulleys that are independent of each other so as to perform independent rotational driving of the first to second substrate seating units 510a to 510b and the robot arm portions 520 and 530.

A plurality of motors (not shown) for performing the independent rotation of the plurality of pulleys may be installed inside the driving unit 540.

Figure 2:
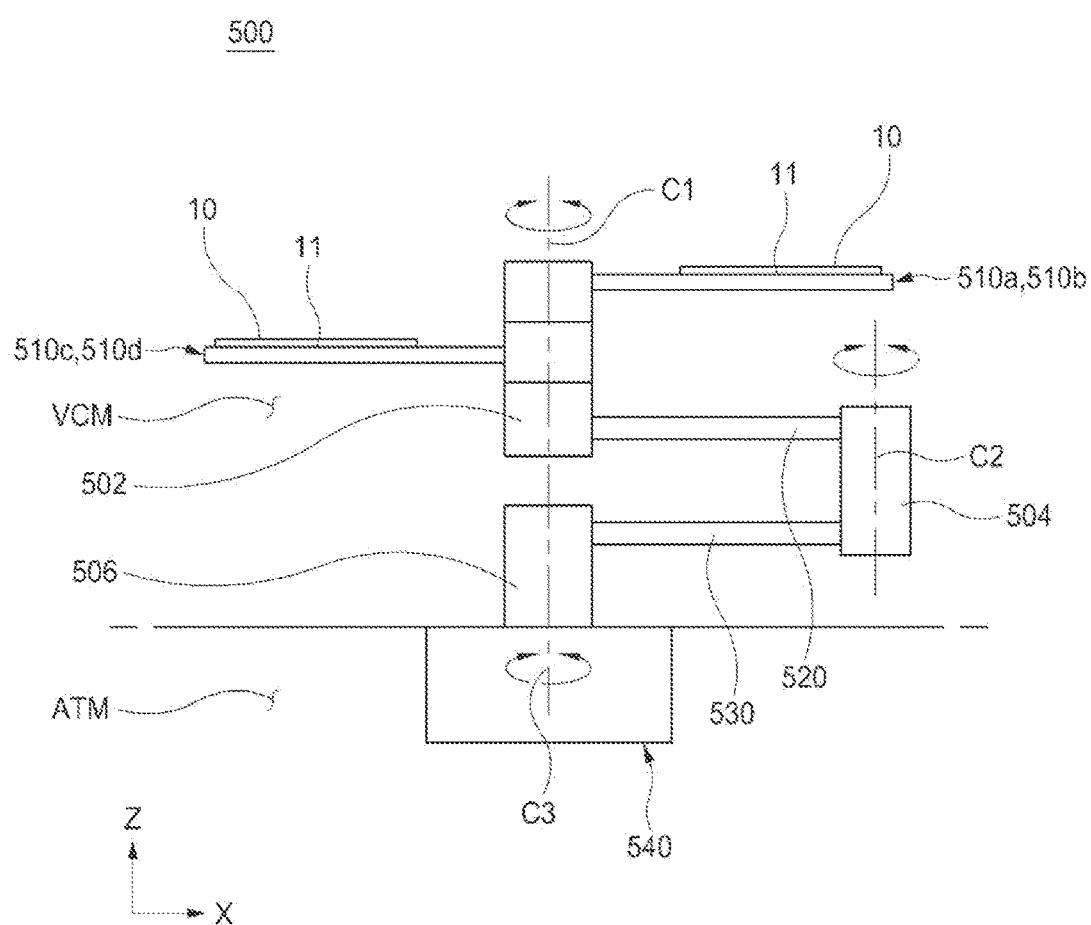
FIG. 2 is a side view illustrating a transfer robot of the substrate processing system of FIG. 1.

As illustrated in FIG. 2, the first to second substrate seating units 510a to 510b and the robot arm units 520 and 530 may be disposed inside the transfer module 300 (vacuum atmosphere (VAC)), and the driving unit 540 may be disposed outside (standby (ATM)) of the transfer module 300.

Although an example in which power is transmitted by the belt-pulley driving method has been described, various driving methods may be applied as long as the first to second substrate seating units 510a to 510d, the first robot arm unit 520, and the second robot arm unit 530 are driven to rotate.

Also, the driving unit 540 may further include a vertical driving unit for adjusting a vertical height of each of the first to second substrate seating units 510a to 510b.

The transfer robot 500 may additionally include a third substrate seating unit 510c and a fourth substrate seating unit 510d, which are disposed side by side on a second plane that is parallel to a first plane and vertically spaced apart from the first plane and are coupled to the first coupling unit 502.

The third substrate seating unit 510c and the fourth substrate seating unit 510d may correspond to the end effector of the transfer robot 500, like the above described first and second substrate seating units 510a and 510b, and the third and fourth substrate seating units 510c and 510d and the first and second substrate seating units 510a and 510b may be configured in the same or similar manner, and thus, differences therebetween will be mainly described.

In case of FIG. 2, a case in which the first plane is disposed above the second plane is illustrated, and the opposite case is possible.

The third substrate seating unit 510c and the fourth substrate seating unit 510d may rotate on the second plans different from each other in a state of being parallel to the first substrate seating unit 510a and the second substrate seating unit 510b and thus may not interfere with each other by the rotation, but may vertically overlap each other.

The third substrate seating unit 510c and the fourth substrate seating unit 510d may be installed to be rotatable about the same rotation axis C1 as the first substrate seating unit 510a and the second substrate seating unit 510b.

Here, the third substrate seating unit 510c and the fourth substrate seating unit 510d may be rotatably coupled to the first coupling unit 502 about the rotation axis C1, and the above-described driving unit and the above-described power transmission part (belt-pulley structure) may be driven to rotate independently from each other.

Here, the first substrate seating unit 510a and the third substrate seating unit 510c may be rotationally symmetric about the rotation axis C1.

Similarly, the second substrate seating unit 510b and the fourth substrate seating unit 510d may be rotationally symmetric about the rotation axis C1.

That is, the first substrate seating unit 510a and the third substrate seating unit 510c may be configured to vertically overlap each other by rotating about the common rotation axis C on different planes.

Likewise, the second substrate seating unit 510b and the fourth substrate seating unit 510d may be configured to vertically overlap each other by rotating about the common rotation axis C1 on different planes.

When the transfer robot 500 additionally includes the third substrate seating unit 510c and the fourth substrate seating unit 510d, the driving unit 540 and the power transmission part may additionally include a configuration for driving the rotation of the third substrate seating unit 510c and the fourth substrate seating unit 510d.

The control unit may be provided in various configurations to control the driving unit 540 for driving the transfer robot 500.

The control unit may control the driving unit 540 to rotate about the rotation axis C1 of the first substrate seating unit 510a to the fourth substrate seating unit 510d and control the operation of the robot arm units 520 and 530.

Hereinafter, a method for transferring a substrate in the substrate processing system including the above-described configurations will be described in detail with reference to FIGS. 3A to 4C.

Figure 3A:
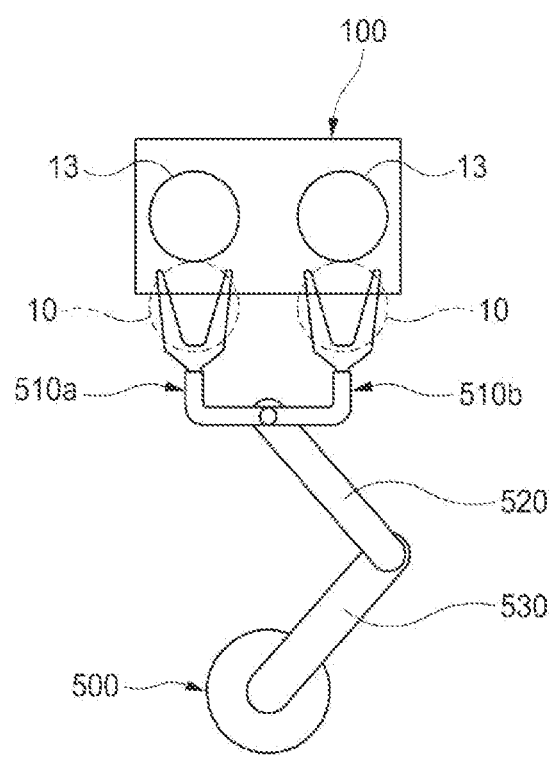
FIGS. 3A and 3B are views illustrating an operation of the transfer robot of FIG. 2, which transfers a substrate to a dual process module.
Figure 3B:
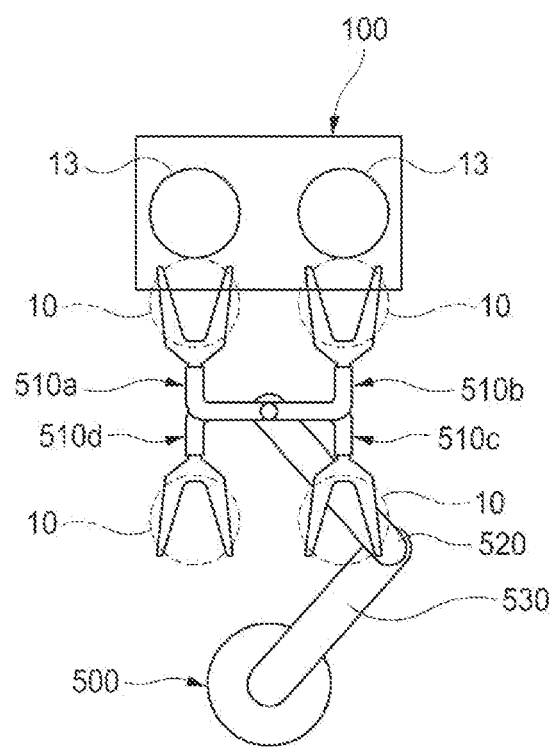

FIGS. 3A to 3B are views illustrating an operation of a transfer robot 500 when the transfer robot 500 transfers two substrates 10 at the same time to a dual process module 100.

When the two substrates 10 are transferred at the same time to the dual process module 100, the control unit may control the first substrate seating unit 510a and the second substrate seating unit 510b to be disposed side by side on a first plane so that the first substrate seating unit 510a and the second substrate seating unit 510b enter at the same time into the dual process module 100.

Here, the first substrate seating unit 510a and the second substrate seating unit 510b may enter at the same time into the dual process module 100 while supporting the two substrates 10 to transfer the two substrates 10 or may enter at the same time into the dual process module 100 to receive the two processed substrate 10.

Also, as illustrated in FIG. 3B, when the transfer robot 500 additionally includes the third substrate seating unit 510c and the fourth substrate seating unit 510d, the control unit may control the remaining third and fourth substrate seating units 510c and 510d, which do not enter into the dual process module 100, so that the third substrate seating unit 510c and the fourth substrate seating unit 510d are disposed at positions at which the third substrate seating unit 510c and the fourth substrate seating unit 510d do not interfere with the substrate transfer.

Since the third substrate seating unit 510c and the fourth substrate seating unit 510d may move to be avoided to regions in which the third substrate seating unit 510c and the fourth substrate seating unit 510d do not interfere with the substrate transfer, the two substrates 10 may be transferred through the first substrate seating unit 510a and the second substrate seating unit 510b.

Furthermore, the third substrate seating unit 510c and the fourth substrate seating unit 510d may be on standby in the regions in which the third substrate seating unit 510c and the fourth substrate seating unit 510d do not interfere with the substrate transfer in a state in which the two substrates to be loaded into the dual process module 100 are seated.

That is, when the first substrate seating unit 510a and the second substrate seating unit 510b enter into the dual process module 100 to carry out processed substrates 10, the third substrate seating unit 510c and the fourth substrate seating unit 510d may be on standby in the state in which substrates 10 to be processed are seated so that if the processed substrates 10 are completely unloaded, the substrates to be processed are immediately loaded into the dual process module 100.

When the first substrate seating unit 510a and the second substrate seating unit 510b enter into the dual process module 100 at the same time to carry the two processed substrates 10 out, the third substrate seating unit 510c and the fourth substrate seating unit 510d, which are on standby in the state in which the substrates 10 to be processed are seated, may be disposed side by side to enter into the dual process module 100.

Here, the first substrate seating unit 510a and the second substrate seating unit 510b may be disposed in the regions in which the first substrate seating unit 510a and the second substrate seating unit 510b do not interfere with the substrate transfer of the third substrate seating unit 510c and the fourth substrate seating unit 510d.

As a result, the two substrates may be continuously loaded into and unload from to the dual process module 100.

Figure 4A:
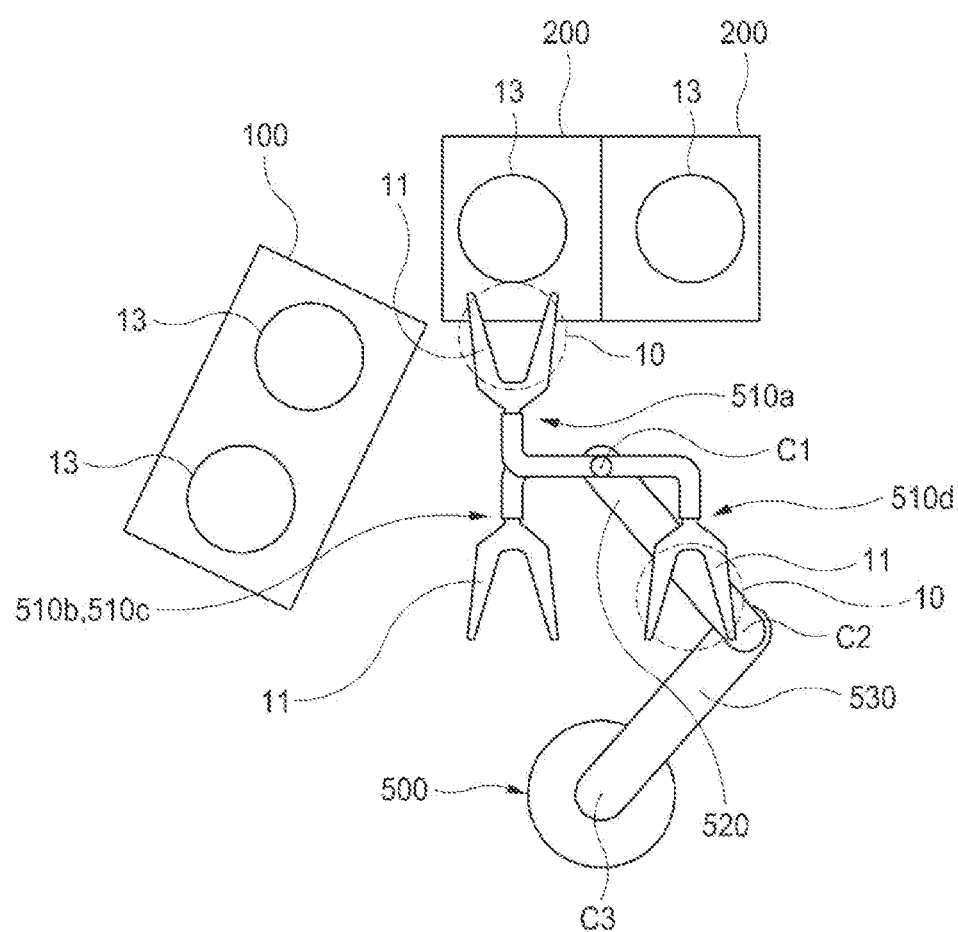
FIGS. 4A to 4C are views illustrating an operation of the transfer robot of FIG. 2, which transfers a substrate to a dual process module.
Figure 4B:
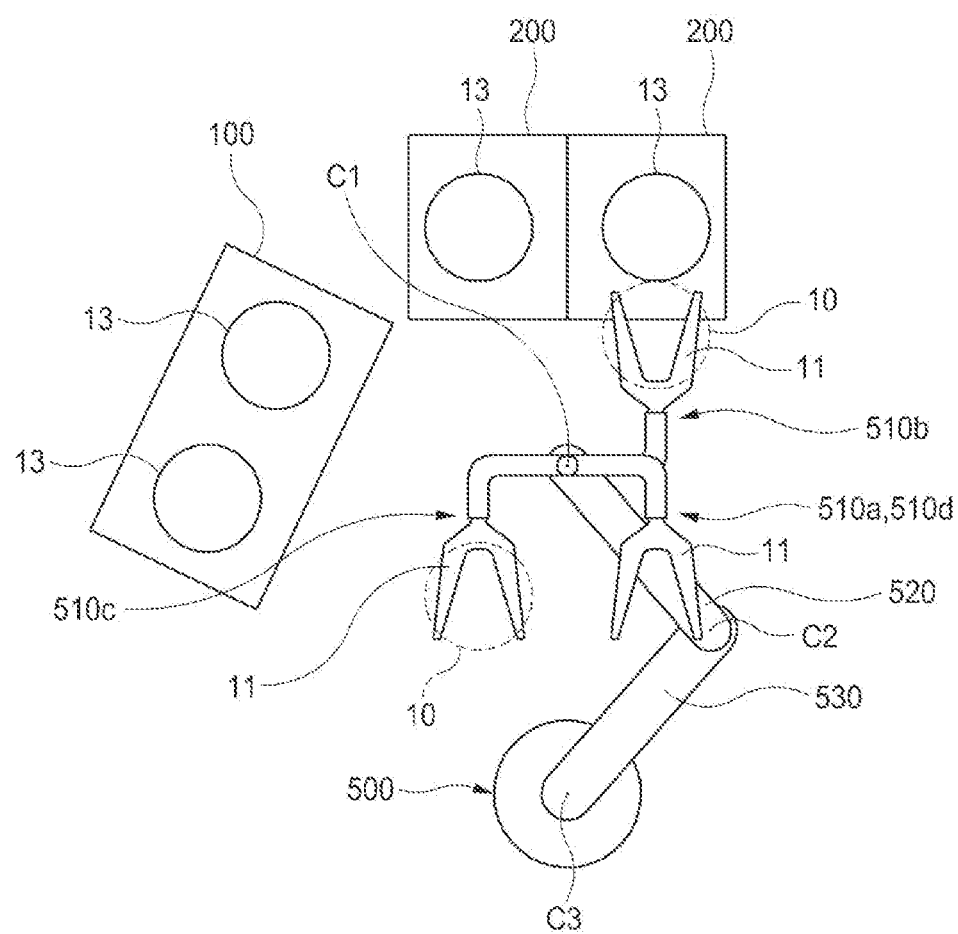
Figure 4C:
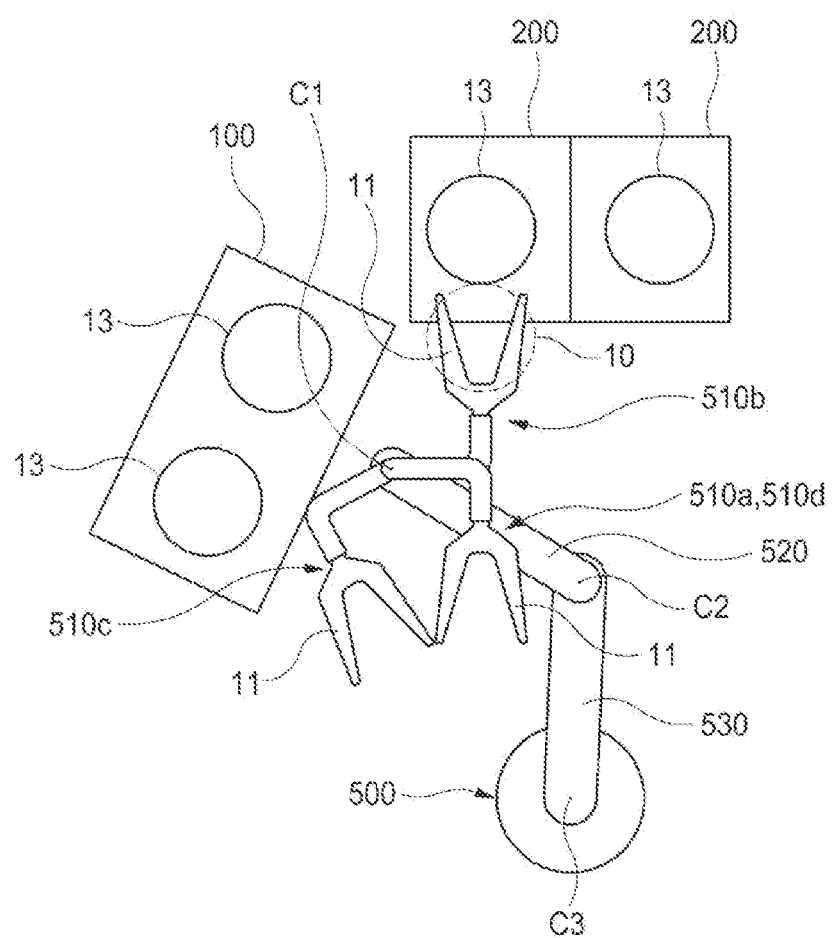

Next, FIGS. 4A to 4C are views illustrating the operation of the transfer robot 500 when the transfer robot 500 transfers one substrate 10 to the single process module 200.

When the transfer robot 500 includes a first substrate seating unit 510a and a second substrate seating unit 510b, at least one of the first substrate seating unit 510a or the second substrate seating unit 510b may be rotatable. That is, the first substrate seating unit 510a and the second substrate seating unit 510b may rotate independently from each other.

More specifically, when transferring a substrate to the single process module 200, one of the first substrate seating unit 510a and the second substrate seating unit 510b may be accessible to the single process module 200 so as to transfer one substrate 10.

Here, the other one of the first substrate seating unit 510a and the second substrate seating unit 510b may be disposed in a region in which the other one of the first substrate seating unit 510a and the second substrate seating unit 510b does not interfere with the substrate transfer.

Also, one of the first substrate seating unit 510a and the second substrate seating unit 510b may be accessible to the single process module 200 to unload the substrate 10 from the single process module 200 so that the substrate 10 is continuously loaded into and unload from the single process module 200, and the other one of the first substrate seating unit 510a and the second substrate seating unit 510b may be on standby in the region in which the other one of the first substrate seating unit 510a and the second substrate seating unit 510b does not interfere with the substrate transfer in the state in which the substrate 10 to be loaded into the single process module 200 is seated.

When the transfer robot 500 further includes a third substrate seating unit 510c and a fourth substrate seating unit 510d, the control unit may control the substrate seating units so that the rest of the first substrate seating unit 510a, the second substrate seating unit 510a, the third substrate seating unit 510c, and the fourth substrate seating unit 510d except for one substrate seating unit entering into the single process module 100 are disposed at positions at which the rest of the substrate seating units 510a to 510d do not interfere with the substrate transfer.

More specifically, when transferring a substrate to the single process module 200, one of the first substrate seating unit 510a to the fourth substrate seating unit 510d may be accessible to the single process module 200 so as to transfer one substrate 10.

Here, the rest of the substrate seating units 510a to 510d may be disposed in regions in which the rest of the substrate seating units 510a to 510d do not interfere with the substrate transfer.

Also, one of the substrate seating units 510a to 510d may be on standby in the region in which one of the substrate seating units 510a to 510d does not interfere with the substrate transfer in the state in which the substrate 10 to be loaded into the single process module 200 is seated so that the substrate 10 is continuously loaded into or unloaded from the single process module 200.

For example, as illustrated in FIGS. 4A and 4C, when the second substrate seating unit 510b enters into the single process module 100, the remaining first, third, and fourth substrate seating units 510a. 510c, and 510d may be disposed in the regions, in which the remaining substrate seating units 510a, 510c, and 510d do not interfere with the substrate transfer, by the control unit.

Also, one of the first substrate seating unit 510a, the third substrate seating unit 510c, and the fourth substrate seating unit 510d may be on standby in the state in which the substrate 10 to be processed is seated so that the substrate 10 to be processed is immediately loaded into the single process module 200 when the processed substrate 10 is completely unloaded.

When the substrate 10 is unloaded from the single process module 100, the substrate support units 510a to 510d, on which the substrates 10 to be processed are seated, may enter into the single process module 100, and the remaining substrate support units may be disposed at the positions at which the remaining substrate support units do not interfere with the substrate transfer.

As a result, the two substrates may be continuously loaded into and unload from to the single process module 200.

Specifically, as illustrated in FIG. 4A, when the first substrate seating unit 510a transfers the substrate 10, the remaining second to fourth substrate seating units 510d except for the first substrate seating unit 510a may be disposed at the positions at which the remaining second to fourth substrate seating units 510d do not interfere with the substrate transfer.

Here, the regions in which the substrate seating units do not interfere with the substrate transfer may mean regions in which the remaining substrate seating units do not interfere with the first substrate seating unit 510a and an inner sidewall of the transfer module 300.

The second to fourth substrate seating units 510b to 510d except for the first substrate seating unit 510a may move to be avoided to the region in which the second to fourth substrate seating units 510b to 510d do not interfere with the substrate transfer so that the transfer robot 500 transfers the substrate to the single process module 500.

Also, one of the second substrate seating unit 510b, the third substrate seating unit 510c, and the fourth substrate seating unit 510d may be on standby in the state in which the substrate 10 to be processed is seated so that the substrate 10 to be processed is immediately loaded into the single process module 200 when the processed substrate 10 is completely unloaded.

FIG. 4A illustrates a case in which the substrate 10 is transferred to the single process module 200 disposed at a right side, and FIG. 4C illustrates a case in which the substrate 10 is transferred to the single process module 200 disposed at a left side.

Here, each of the first to fourth substrate seating units 510a to 510d may transfer one substrate 10 to the single process module 200 at a time, regardless of the left and right positions of the single process 200.

That is, the second substrate seating unit 510b may transfer one substrate 10 to correspond to both the cases illustrated in FIGS. 4A and 4C. Here, each of the remaining substrate seating units 510b to 510d may be driven to rotate independently of each other so as to be avoided to the region in which the substrate seating units do not interfere with the substrate transfer.

Figure 5A:
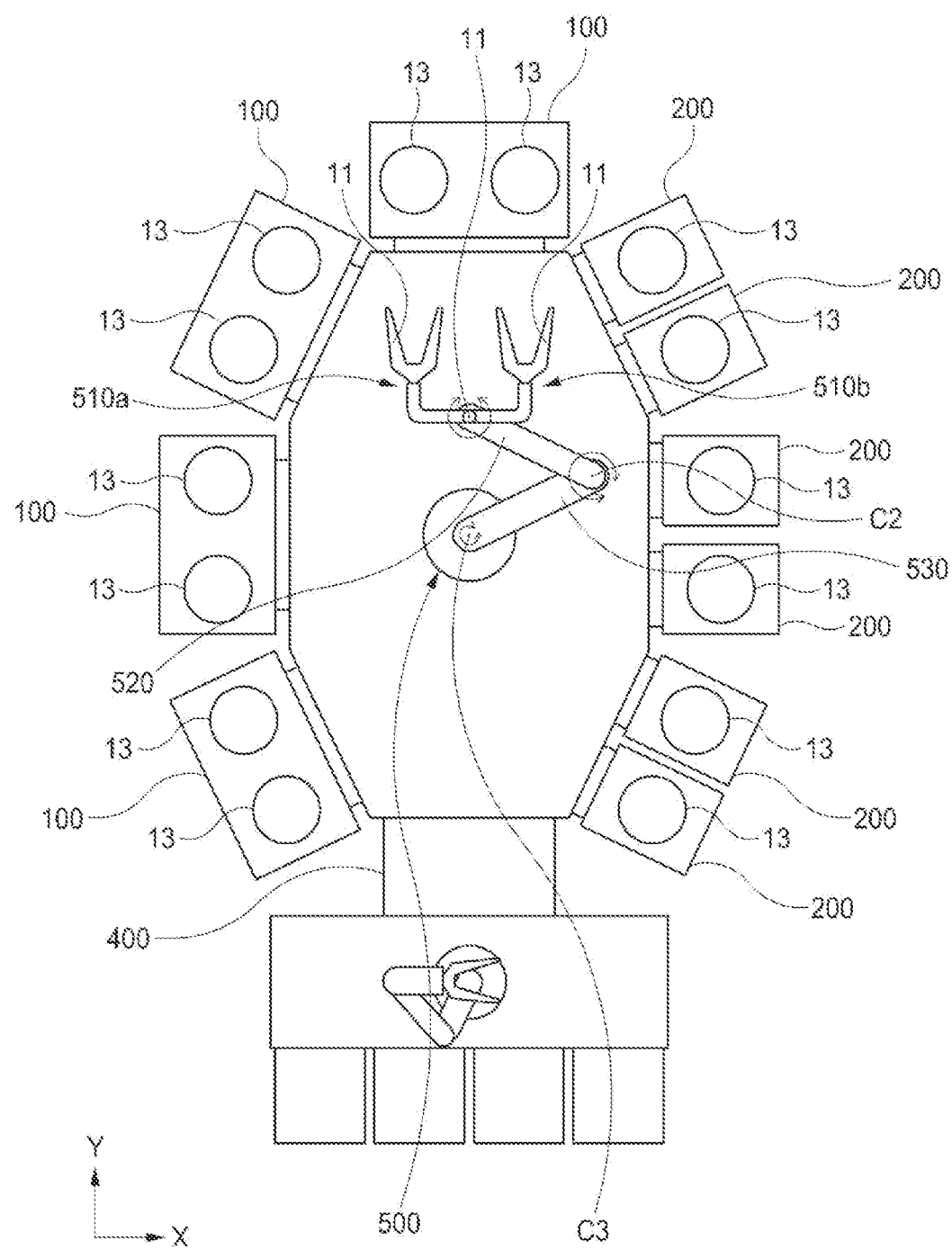
FIGS. 5A and 5B are plan views of a substrate processing system according to another embodiment of the present invention.
Figure 5B:
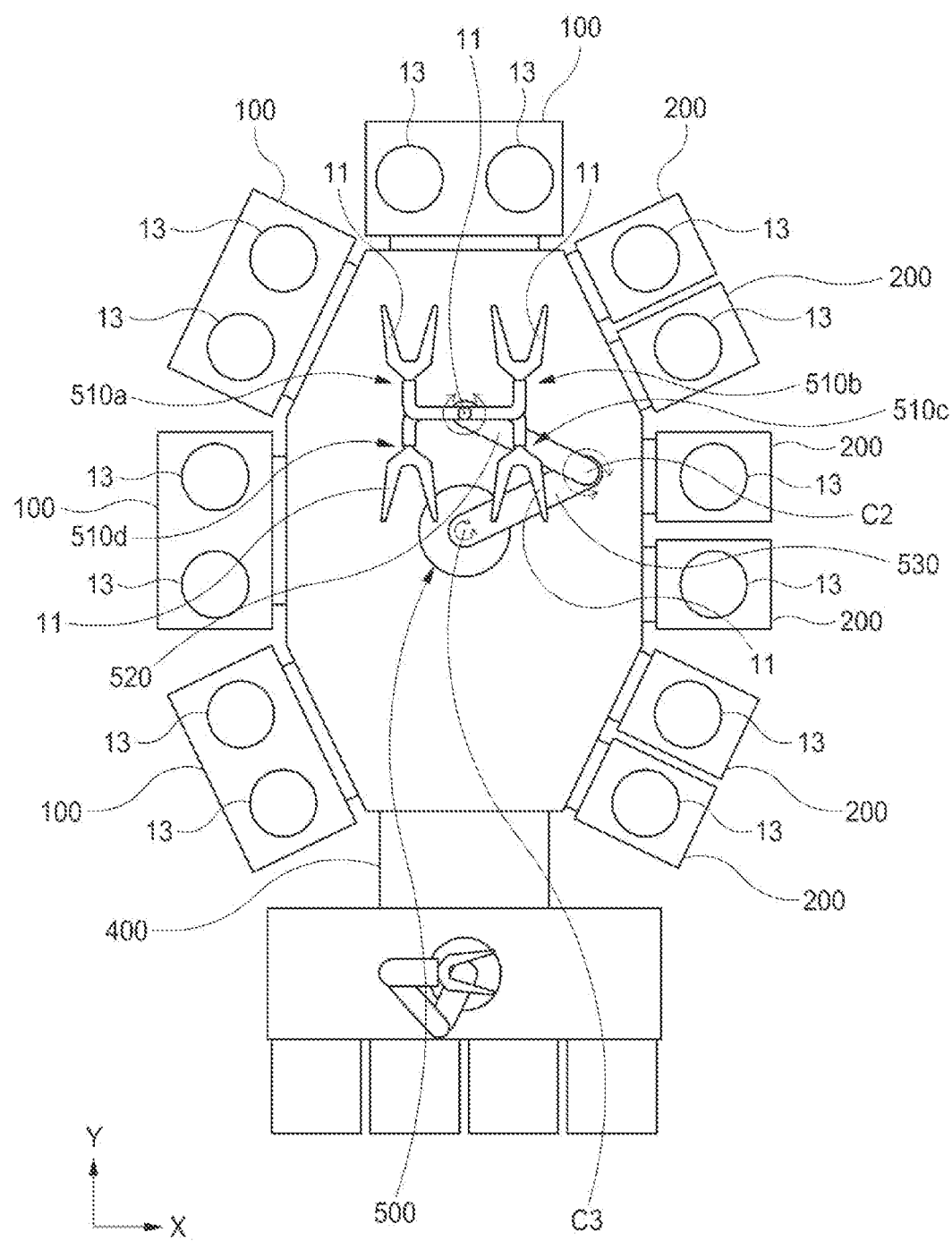

FIGS. 5A and 5B are cross-sectional views of a substrate processing system according to another embodiment of the present invention.

A transfer robot 500 according to the present invention may be applied to any substrate processing system as long as the substrate processing system includes both a dual process module 100 and a single process module 200.

The substrate processing apparatus according to the present invention may include both the single process module and the dual process module in the one substrate processing system to minimize the frequency of the exposure of the substrate to the atmosphere, thereby improving the quality factor of the substrate processing and also maximizing the productivity of the substrate processing.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing system comprising:
   a transfer module (300) provided with a transfer robot (500) configured to transfer substrates (10);
   one or more dual process modules (100) each of which is installed at one side of the transfer module (300) so that two substrates (10) are accessible at the same time and on which a pair of substrate support units (13) configured to respectively seat the two substrates (10) thereon are disposed horizontally; and
   one or more single process modules (200) each of which is installed at one side of the transfer module (300) so that one substrate (10) is accessible and on which one or more substrate support units (13) configured to seat the substrates (10) thereon are provided,
   wherein the transfer robot (500) comprises a first substrate seating unit (510a) and a second substrate seating unit (510b), each of which has a seating surface (11), on which the substrate (10) is seated, and a first coupling unit (502), to which the first substrate seating unit (510a) and the second substrate seating unit (510b) are coupled, and
   wherein each of the seating surface are disposed on the same first plane, and
   at least one of the first substrate seating unit (510a) or the second substrate seating unit (510b) is installed to be rotatable about a vertical rotation axis (C1) formed by the first coupling unit (502) so as to be disposed in a region in which the at least one of the first substrate seating unit (510a) or the second substrate seating unit (510b) does not interfere with the substrate transfer when the substrates (10) are transferred.

2. The substrate processing system of claim 1, wherein, when the substrates (10) are transferred to the dual process module (100), the first substrate seating unit (510a) and the second substrate seating unit (510b) are disposed side by side to transfer the two substrates (10) at the same time to the dual process module (100).

3. The substrate processing system of claim 1, wherein, when the substrates (10) are transferred to the single process module (200), one of the first substrate seating unit (510a) and the second substrate seating unit (510b) is accessible to the single process module (200) so as to transfer one substrate (10), and
the other one of the first substrate seating unit (510a) and the second substrate seating unit (510b) is disposed in a region in which the other one of the first substrate seating unit (510a) and the second substrate seating unit (510b) does not interfere with the substrate transfer.

4. The substrate processing system of claim 1, wherein, when the substrates (10) are transferred to the single process module (200), one of the first substrate seating unit (510a) and the second substrate seating unit (510b) is accessible to the single process module (200) to unload the substrate (10) from the single process module (200), and
the other one of the first substrate seating unit (510a) and the second substrate seating unit (510b) is on standby in a region in which the other one of the first substrate seating unit (510a) and the second substrate seating unit (510b) does not interfere with the substrate transfer in the state in which the substrate (10) to be loaded into the single process module (200) is seated.

5. The substrate processing system of claim 1, wherein the transfer robot (500) further comprises:
a driving unit (540) configured to perform movement of the first coupling unit (502) in a three-dimensional space and rotation of at least one of the first substrate seating unit (510a) or the second substrate seating unit (510b) with respect to the rotation axis (C1); and
a control unit configured to control an operation of the driving unit (540).

6. The substrate processing system of claim 1, wherein the first substrate seating unit (510a) and the second substrate seating unit (510b) are driven to rotate independently from each other with respect to the rotation axis (C1).

7. The substrate processing system of claim 1, wherein the transfer robot (500) further comprises a third substrate seating unit (510c) and a fourth substrate seating unit (510d), each of which has a seating surface (11) on which the substrate (10) Is seated and are coupled to the first coupling unit (502), and
Wherein each of the seating surface (11) are on a second plane that is parallel to the first plane and vertically spaced apart from the first plane.

8. The substrate processing system of claim 7, wherein the third substrate seating unit (510c) and the fourth substrate seating unit (510d) are installed to be rotatable around the rotation axis (C1).

9. The substrate processing system of claim 7, wherein, when the substrates (10) are transferred to the dual process module (100), the third substrate seating unit (510c) and the fourth substrate seating unit (510d) are on standby in regions in which the third substrate seating unit (510c) and the fourth substrate seating unit (510d) do not interfere with the substrate transfer in a state in which the two substrates (10) to be loaded into the dual process module (100) are seated.

10. The substrate processing system of claim 7, wherein the first substrate seating unit (510a) and the third substrate seating unit (510c) are rotationally symmetric about the rotation axis (C1), and
the second substrate seating unit (510b) and the fourth substrate seating unit (510d) are rotationally symmetric about the rotation axis (C1).

11. The substrate processing system of claim 7, wherein the first substrate seating unit (510a), the second substrate seating unit (510b), the third substrate seating unit (510c), and the fourth substrate seating unit (510d) are driven to rotate independently from each other with respect to the rotation axis (C1).

12. The substrate processing system of claim 1, further comprising a load lock module (400) coupled to one side of the transfer module (300) to transfer the substrate (10) between the transfer modules (300).

13. A transfer robot, which is provided in a transfer module (300) of a substrate processing system comprising: the transfer module (300) configured to transfer substrates (10); one or more dual process modules (100) each of which is installed at one side of the transfer module (300) so that two substrates (10) are accessible at the same time and on which a pair of substrate support units (13) configured to respectively seat the two substrates (10) thereon are disposed horizontally; and one or more single process modules (200) each of which is installed at one side of the transfer module (300) so that one substrate (10) is accessible and on which one or more substrate support units (13) are provided, the transfer robot comprising:
a first substrate seating unit (510a) and a second substrate seating unit (510b), each of which has a seating surface (11), on which the substrate (10) is seated, and which are disposed on the same first plane, and a first coupling unit (502), to which the first substrate seating unit (510a) and the second substrate seating unit (510b) are coupled, and
wherein each of the seating surface are disposed on the same first plane, and
wherein at least one of the first substrate seating unit (510a) or the second substrate seating unit (510b) is installed to be rotatable about a vertical rotation axis formed by the first coupling unit (502) so as to be disposed in a region in which the at least one of the first substrate seating unit (510a) or the second substrate seating unit (510b) does not interfere with the substrate transfer when the substrates (10) are transferred.

* * * * *